(12) United States Patent
Ninomiya

(10) Patent No.: US 6,480,396 B2
(45) Date of Patent: Nov. 12, 2002

(54) PRINTED CIRCUIT BOARD AND ELECTRONIC EQUIPMENT USING THE BOARD

(75) Inventor: Ryoji Ninomiya, Tachikawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/803,024

(22) Filed: Mar. 12, 2001

(65) Prior Publication Data

US 2001/0048592 A1 Dec. 6, 2001

(30) Foreign Application Priority Data

May 31, 2000 (JP) ........................................ 2000-163033

(51) Int. Cl.⁷ ................................................ H05K 7/02
(52) U.S. Cl. ...................... 361/780; 174/261; 174/255; 361/750; 361/760; 361/766; 361/794
(58) Field of Search ................................. 361/780, 750, 361/751, 760, 763, 766, 794, 762, 748; 174/52.2, 52.3, 261, 251, 255, 258, 250; 333/86, 32, 33; 257/773, 775

(56) References Cited

U.S. PATENT DOCUMENTS

| | | | | |
|---|---|---|---|---|
| 4,827,327 A | * | 5/1989 | Miyauchi et al. ............ 257/700 |
| 4,945,399 A | * | 7/1990 | Brown et al. ................ 257/698 |
| 5,341,274 A | * | 8/1994 | Nakatami et al. ........... 361/818 |
| 5,639,989 A | * | 6/1997 | Higgins, III ........... 174/35 MS |
| 5,708,400 A | * | 1/1998 | Morris ......................... 333/12 |
| 5,912,809 A | * | 6/1999 | Steigerwald et al. ......... 361/780 |
| 5,926,377 A | * | 7/1999 | Nakao et al. ................ 361/763 |
| 5,966,294 A | * | 10/1999 | Harada et al. ............... 361/794 |
| 6,091,310 A | * | 7/2000 | Utsumi et al. ................. 333/12 |
| 6,111,479 A | | 8/2000 | Myohga et al. |
| 6,166,457 A | * | 12/2000 | Iguchi et al. .................. 307/91 |
| 6,198,362 B1 | * | 3/2001 | Harada et al. ................. 333/12 |
| 6,297,965 B1 | * | 10/2001 | Sasaki et al. ................. 361/782 |

* cited by examiner

Primary Examiner—David L. Talbott
Assistant Examiner—Ishwar B Patel
(74) Attorney, Agent, or Firm—Finnegan, Henderson, Farabow, Garrett & Dunner, L.L.P.

(57) ABSTRACT

An insulation layer is formed on a ground layer. The insulation layer includes first and second regions for forming wiring layers. The impedance of a wiring layer formed on the second region is lower than that of a wiring layer formed on the first region. A signal line pattern is formed on the wiring layer on the first region of the insulation layer. A power supply plane is formed on the wiring layer on the second region of the insulation layer in order to feed power to the signal line pattern through a termination resistor connected to the signal line pattern.

5 Claims, 9 Drawing Sheets

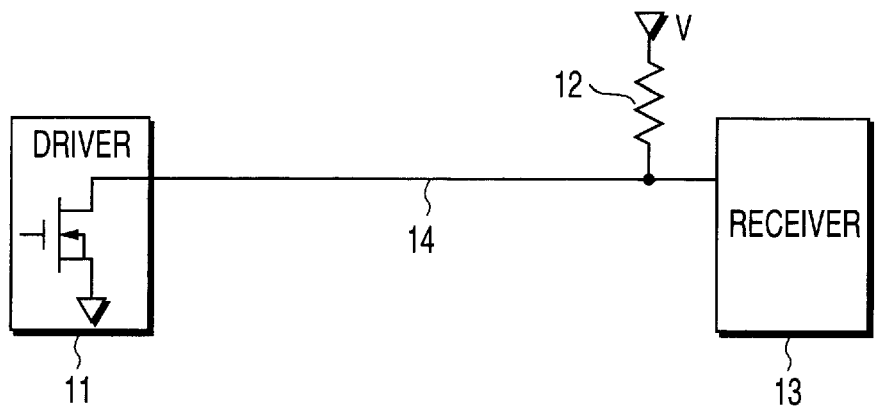
F I G. 1
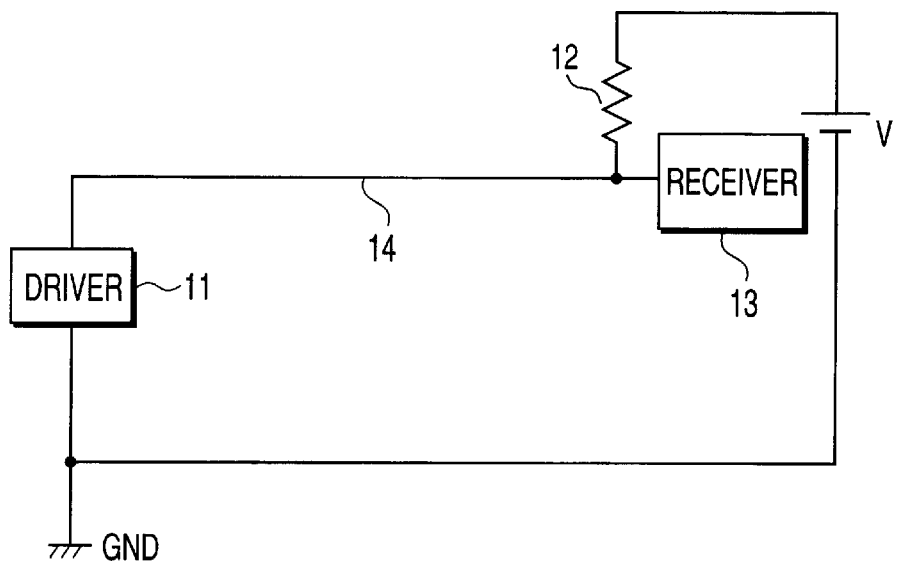
F I G. 2
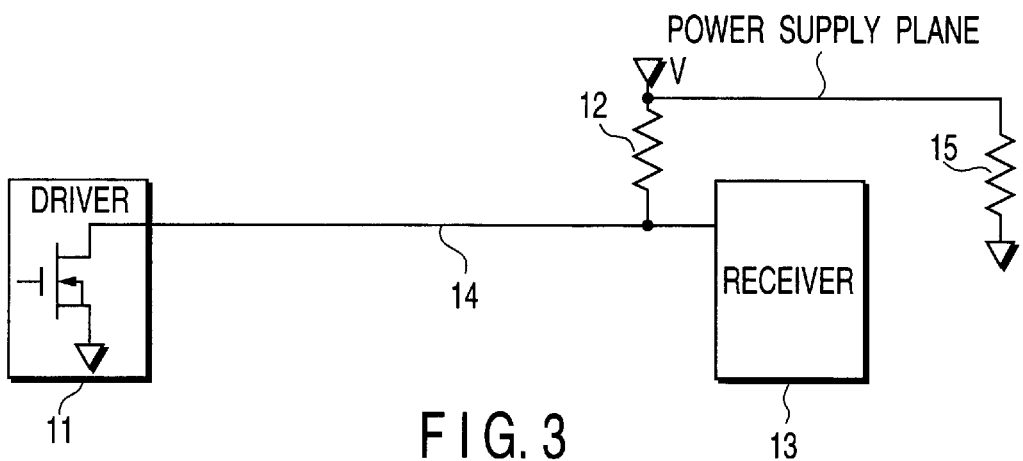
F I G. 3

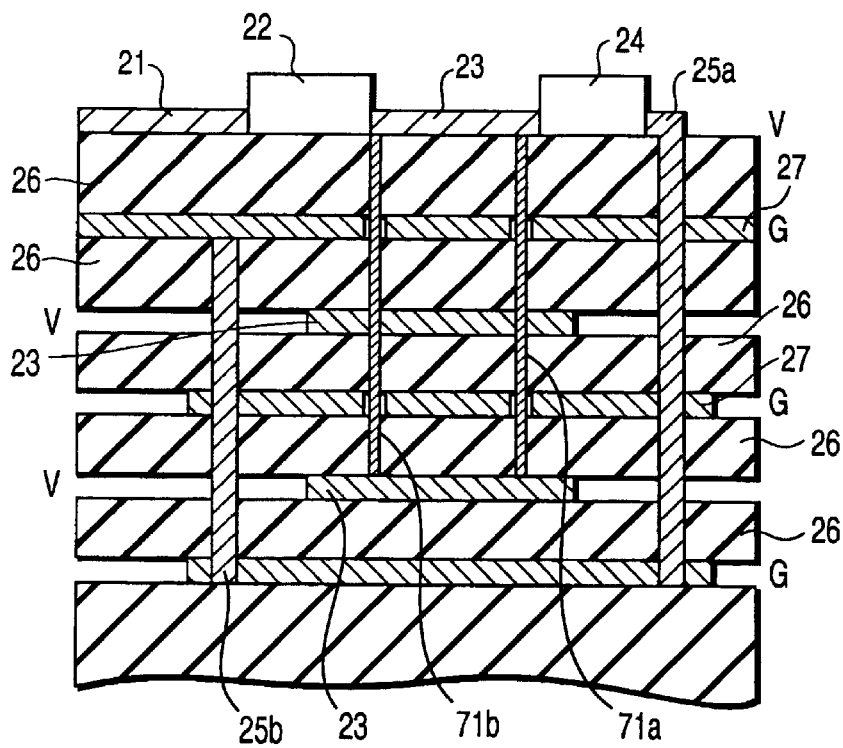
F I G. 16
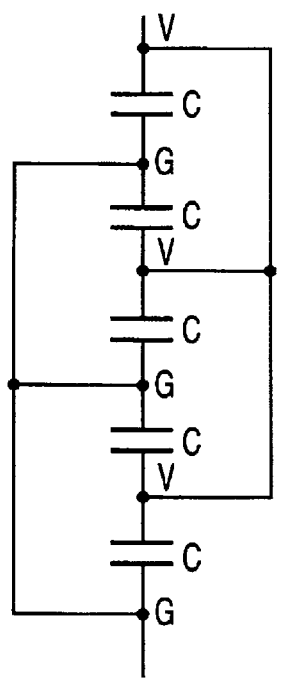
F I G. 17

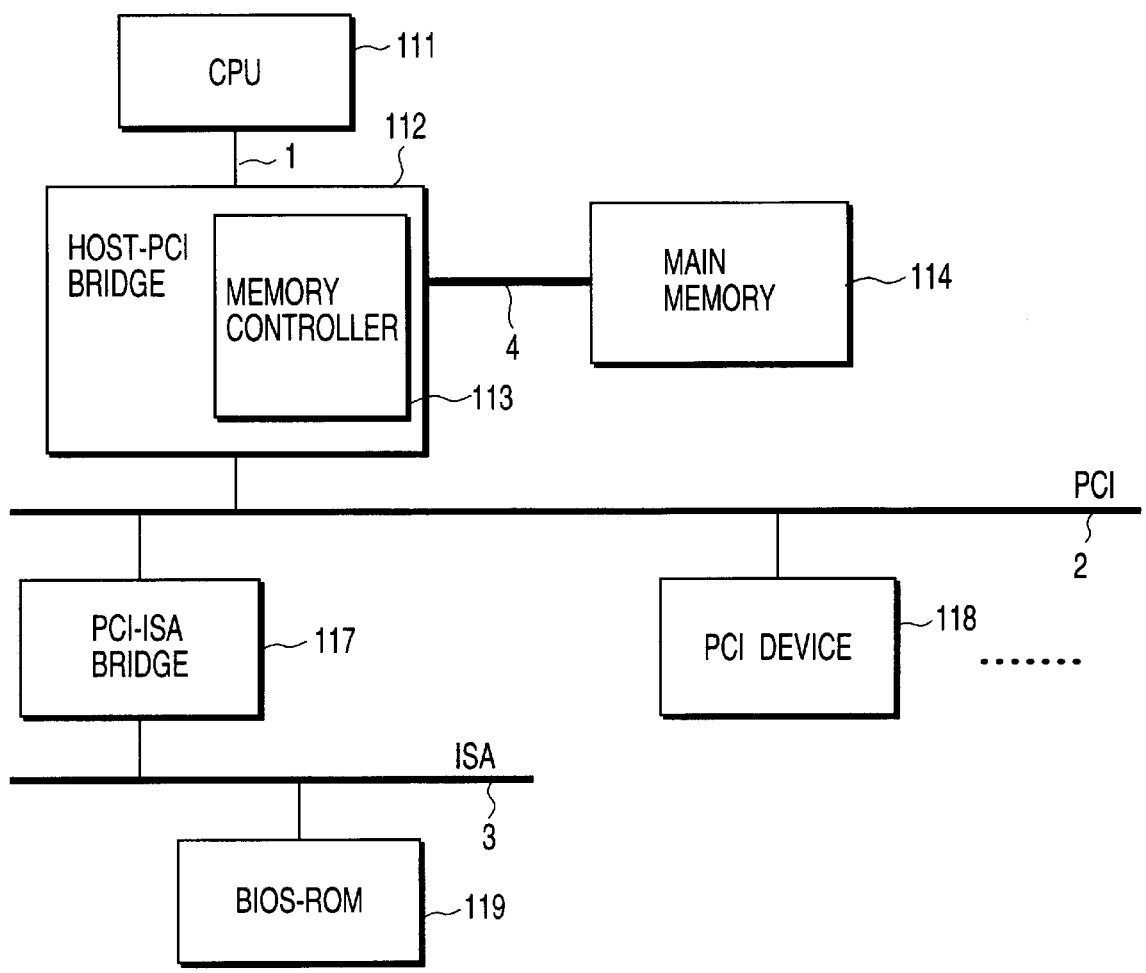
F I G. 20

PRINTED CIRCUIT BOARD AND ELECTRONIC EQUIPMENT USING THE BOARD

CROSS-REFERENCE TO RELATED APPLICATIONS

This application is based upon and claims the benefit of priority from the prior Japanese Patent Application No. 2000-163033, filed May 31, 2000, the entire contents of which are incorporated herein by reference.

BACKGROUND OF THE INVENTION

The present invention relates to a printed circuit board and electronic equipment using the board. More specifically, the present invention relates to a printed circuit board that is favorable for achieving a high-speed signal interface requiring precise impedance matching, and electronic equipment using the printed circuit board.

Recently, in computer systems such as a personal computer, the speed of CPU and memory devices has increased to improve the overall system performance. The memory device used as the main storage has shifted from DRAM to DRAM with an EDO mode or a synchronous DRAM, and recently high-speed memory devices such as Rambus DRAM have been employed. A clock speed of CPU beyond 1 GHz has also recently been developed.

In accordance with the advances in speed of devices, the cycle time of signal transfer on the system board is being shortened year by year, necessitating the design of high-speed buses. When such a high-speed bus is used, precise impedance matching is required in order to prevent problems caused by reflection of transmitted signals.

When a signal is transmitted at high speed, a terminator (termination resistor) is often provided at the termination of a signal line in order to reduce the influence of reflection of the signal to a minimum. If the impedance of the signal line and that of the termination resistor are matched, reflection of the signal can be prevented and thus distortion is avoided.

In actual printed circuit boards, however, a power supply plane for supplying power to a signal line through a termination resistor has an impedance. Thus, the impedances of the termination resistor and the power supply plane are added to that of the signal line. Even if a termination resistor of the same impedance of that of the signal line itself, e.g., 50Ω, is connected to the signal line, precise impedance matching is still difficult to obtain.

BRIEF SUMMARY OF THE INVENTION

An object of the present invention is to provide a printed circuit board capable of performing more precise impedance matching, and electronic equipment using the printed circuit board.

To attain the above object, a printed circuit board according to a first aspect of the present invention comprises: a ground layer; an insulation layer provided on the ground layer, including a first region having a first structure and a second region having a second structure; a first conductive pattern provided on the first region of the insulation layer; and a second conductive pattern provided on the second region of the insulation layer; wherein the second structure has an effect to reduce an impedance of the second conductive pattern, the effect is greater than an effect of the first structure to reduce an impedance of the first conductive pattern.

In the printed circuit board so constituted, the second conductive pattern provided on the second region of the insulation layer has an impedance which is lower than that of the first conductive pattern provided on the first region of the insulation layer. Thus, the impedance of the power supply plane to be formed of the second conductive pattern can be lowered, and the impedance of the termination resistor can easily be matched with that of the signal line. Consequently, precise impedance matching can be achieved.

Preferably, the insulation layer of the second region can be thinner than the insulation layer of the first region thereof, and the insulation layer can be constituted of two types of insulation members having different dielectric constants such that the dielectric constant of the insulation layer of the second region is higher than that of the insulation layer of the first region.

Moreover, the power supply plane can be coated with a dielectric material. Since, therefore, the area of contact between the power supply plane and the insulation layer can be increased, the impedance of the power supply plane can be lowered. It is preferable that marking paint be used as the dielectric material which coats the power supply plane. The marking paint is used to a mark the printed circuit board with the model numbers of electronic components and its relative dielectric constant is about 3. By using the marking paint as a dielectric material for coating the power supply plane, the impedance of the power supply plane can easily be lowered without preparing any special material.

According to a second aspect of the present invention, a printed circuit board in which a wiring layer is formed on a ground layer with a first insulation layer interposed therebetween, comprises: a first power supply plane provided on the wiring layer, for feeding power to a signal line formed on the wiring layer through a termination resistor connected to the signal line; a first via hole formed through the first insulation layer, for electrically connecting the first power supply plane and the ground layer; a second power supply plane provided under the ground layer with a second insulation layer interposed therebetween; and a second via hole formed through the first insulation layer, the ground layer, and the second insulation layer, for electrically connecting the first power supply plane and the second power supply plane.

In the printed circuit board so constituted, the second power supply plane is provided under the ground layer with the second insulation layer interposed therebetween, and thus the ground layer is sandwiched between the first and second power supply planes with the first and second insulation layers interposed therebetween. The capacitor including the first power supply plane, first insulation layer and ground layer is therefore connected in parallel with the capacitor including the first power supply plane, first insulation layer and ground layer, and the dielectric constant of the insulation layer, that exercises an influence on the impedance of the first power supply plane, can be lowered in substance. Consequently, the impedance of the first power supply can be lowered and the impedance of the termination resistor can easily be matched with that of the signal line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram of a high-speed bus interface circuit mounted on a printed circuit board according to the present invention;

FIG. 2 is a circuit diagram of an equivalent circuit of the high-speed bus interface circuit shown in FIG. 1;

FIG. 3 is a circuit diagram explaining impedance that is present between a power supply and a ground in the high-speed bus interface circuit shown in FIG. 1;

FIG. 16 is a cross-sectional view of the structure of a printed circuit board according to a fifth embodiment of the present invention;

FIG. 17 is a diagram explaining capacitors including power supply planes and ground layers arranged on the printed circuit board shown in FIG. 16;

FIG. 20 is a block diagram illustrating an example of the configuration of a computer system using the printed circuit board of the present invention.

DETAILED DESCRIPTION OF THE INVENTION

Figure 4:
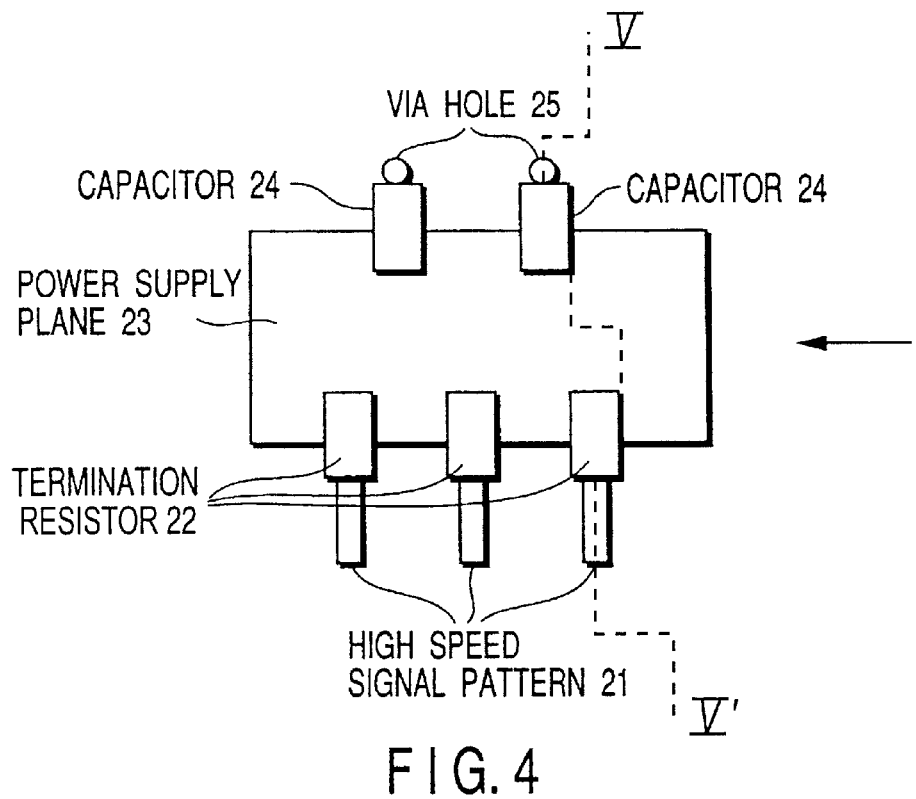
FIG. 4 is a plan view explaining a basic structure of a printed circuit board.

Embodiments of the present invention will now be described with reference to the accompanying drawings.

Referring to FIG. 1, a high-speed bus interface mounted on a printed circuit board will be discussed first. FIG. 1 schematically shows a high-speed bus interface circuit called GTL (Gunning Transceiver Logic). As shown in FIG. 1, a driver circuit 11, a termination resistor (terminator) 12, and a receiver circuit 13 are connected to a signal line 14. The driver circuit 11 includes a gate logic of an open-drain type. In order to drive the signal line 14, the gate logic connects/disconnects the signal line 14 and the ground terminal to/from each other. The termination resistor 12 is a load used for impedance matching, and one end of which is connected to the signal line 14 and the other end of which is connected to a power supply terminal V. The coincidence of impedance Zo of the signal line 14 with the resistance of the termination resistor 12 prevents a signal of the signal line 14 from being reflected and thus allows the signal to be transmitted without distortion. A microstrip line is employed as the signal line 14.

FIG. 2 illustrates an equivalent circuit of the high-speed bus interface circuit shown in FIG. 1. In the microstrip line structure, first and second two layers are laminated one on another with an insulation layer interposed therebetween. The signal line 14 is formed in the first layer which serves as a conductive pattern, and the second layer serves as a ground layer. In the first layer, a current flows from the power supply terminal V to the driver circuit 11 through the signal line 14 and then returns to the power supply terminal V through the ground layer of the second layer. Thus, the circuit of FIG. 1 is represented as a closed-loop circuit shown in FIG. 2.

The termination resistor 12 is connected to the power supply terminal V. If the impedance of a power supply plane, which is provided in the first layer as the power supply terminal V, is 0, a waveform free of reflection can be obtained according to the theory by making the resistance of the termination resistor 12 coincide with the impedance Zo of the signal line 14 itself. In the actual printed circuit board, however, the impedance of the power supply plane does not become 0 but has some values. This phenomenon is shown in FIG. 3.

In FIG. 3, reference numeral 15 denotes impedance of the power supply plane. In actuality, the impedance added to the signal line 14 corresponds to the sum of the impedance of the termination resistor 12 and the impedance 15 of the power supply plane. Specifically, the impedance 15 is generated by the power supply plane and a via hole (grounding via) for connecting the power supply plane to the ground layer of the second layer.

As a method of lowering the impedance of the power supply plane, a decoupling capacitor can be connected between the power supply plane and the via hole. If, however, a normal ceramic capacitor is simply used as the decoupling capacitor, an adequate decrease in impedance cannot be expected in a frequency band beyond 1 GHz in view of characteristics of the capacitor.

Figure 5:
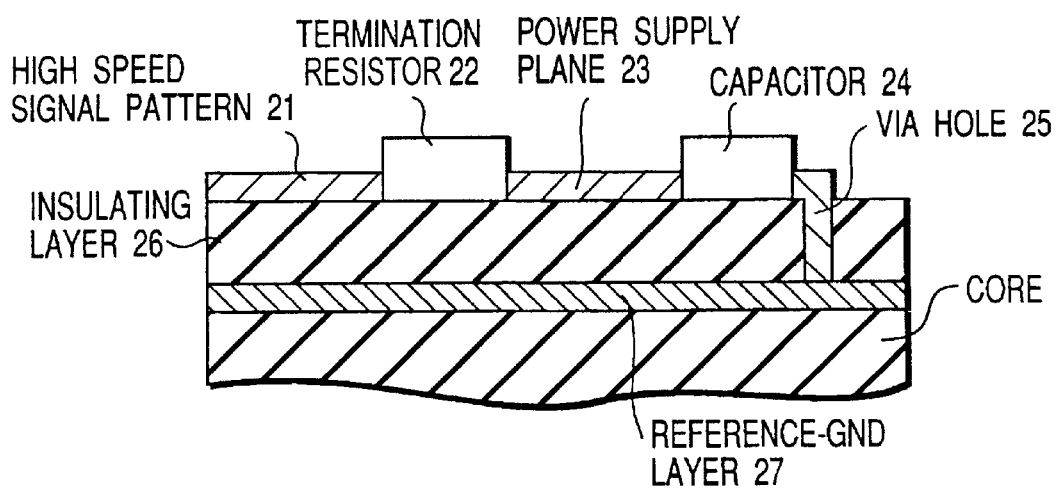
FIG. 5 is a cross-sectional view of the printed circuit board shown in FIG. 4 taken along line V-V'.

Referring to FIGS. 4 and 5, the basic structure of a printed circuit board of the present invention will now be described. The printed circuit board (which is also called a printed wiring board) is used to mount electronic components for high-speed signal transfer requiring precise impedance control. For example, it is used as a computer's system board, a memory board, a board on which an RF circuit is mounted, and the like. Hereinafter the structure of the printed circuit board will be explained taking a microstrip line structure favorable for high-speed signal transfer as an example.

FIG. 4 is a plan view of an area of the printed circuit board, which is viewed from the top, and FIG. 5 is a cross-sectional view thereof, which is viewed from the direction of the arrow shown in FIG. 4 and along line V-V'.

A reference ground layer (reference GND layer) 27, which is constituted of a uniform copper layer, is formed on a core made of an insulation substrate. An insulation layer 26 is provided on the reference GND layer 27. A conductive layer for forming conductive pattern is formed on the insulation layer 26. A signal line pattern 21 serving as a high-speed signal line (referred to as a high-speed signal pattern) and a power supply plane 23 are formed of the conductive pattern on the insulation layer 26.

The power supply plane 23 is a feeding section for feeding power to the high-speed signal pattern 21 through a termination resistor 22 connected to the pattern 21. The feeding section is connected to a through hole 25 via a decoupling capacitor element 24. The through hole 25 is a grounding via hole formed so as to penetrate the insulation layer 26, and it electrically connects the power supply plane 23 to the reference GND layer 27 through the decoupling capacitor element (bypass capacitor) 24. The inner wall of the via hole 25 is coated with metal.

A specific structure for decreasing the impedance of the power supply plane 23 will be discussed below.

(First Embodiment)

Figure 6:
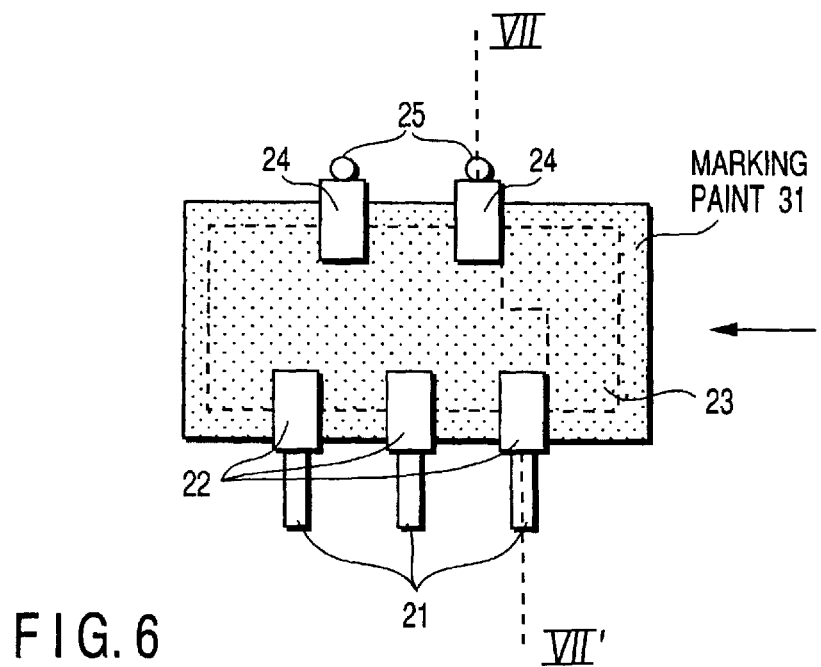
FIG. 6 is a plan view of the structure of a printed circuit board according to a first embodiment of the present invention.
Figure 7:
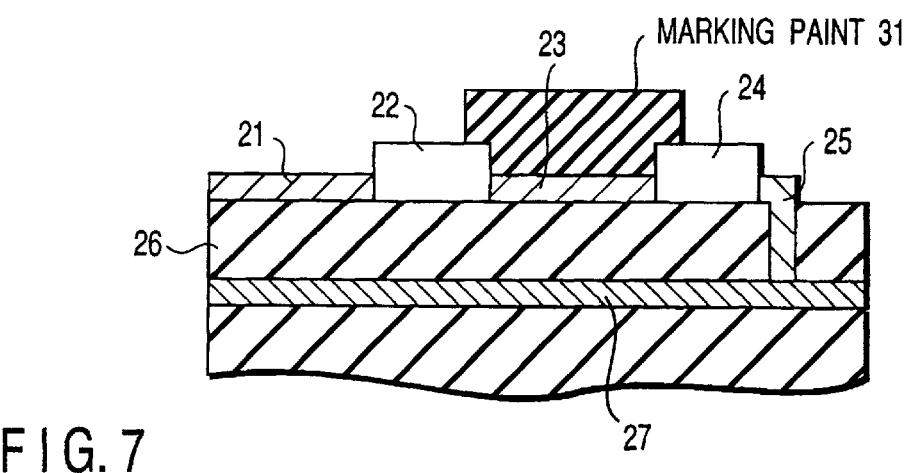
FIG. 7 is a cross-sectional view of the printed circuit board shown in FIG. 6, taken along line VII-VII'.
Figure 8:
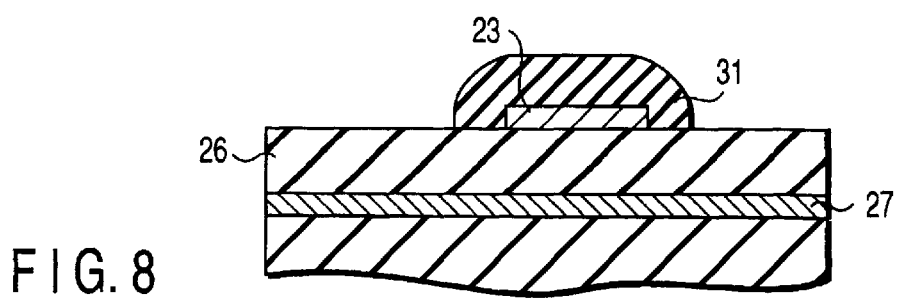
FIG. 8 is a cross-sectional view of the printed circuit board shown in FIG. 6, which is viewed from another direction.

A printed circuit board according to a first embodiment of the present invention will now be described with reference to FIGS. 6 to 8. FIG. 6 is a view of the printed circuit board including termination resistors 22 connected to high-speed signal patterns 21 and a power supply plane 23, which are viewed from the top. FIG. 7 is a cross-sectional view of the printed circuit board, which is viewed from the direction of the arrow shown in FIG. 6 and along line VII-VII'. FIG. 8 is also a cross-sectional view thereof, which is viewed from the direction perpendicular to the arrow shown in FIG. 6.

The power supply plane 23 is formed of the conductive pattern on the insulation layer 26 and coated with marking paint 31. The marking paint 31 is used to mark the printed circuit board with the model numbers of components on the printed circuit board in the final step of manufacturing the printed circuit board (before the components are mounted). The marking paint 31 consists of insulation material, and the relative dielectric constant of the marking paint 31 is as relatively high as about 3. The power supply plane 23 has a microstrip line structure, like the high-speed signal pattern 21. In the microstrip line structure, it is known that the higher the relative dielectric constant of the insulation layer 26, the lower the impedance per unit area of the power supply plane 23 (the unit area impedance of the power supply plane 23) on the insulation layer 26, and the larger the area of contact between the power supply plane 23 and the insulation layer 26, the lower the impedance of the power supply plane 23.

Since the power supply plane 23 is coated with the marking paint 31 with a high relative dielectric constant, and the marking paint 31 contacts the surface of the insulation layer 26, a larger area of the plane 23 can be brought into contact with the insulation layer 26. Therefore, the impedance of the power supply plane 23 can be decreased below that of the high-speed signal pattern 21.

If the coating of the power supply plane 23 with the marking paint 31 is simply added to the basic structure of the printed circuit board shown in FIGS. 4 and 5, the impedance of the power supply plane 23 can be lowered. Consequently, more precise impedance matching can be achieved using the termination resistor 22 whose impedance is the same as that of the high-speed signal pattern 21.

(Second Embodiment)

Figure 9:
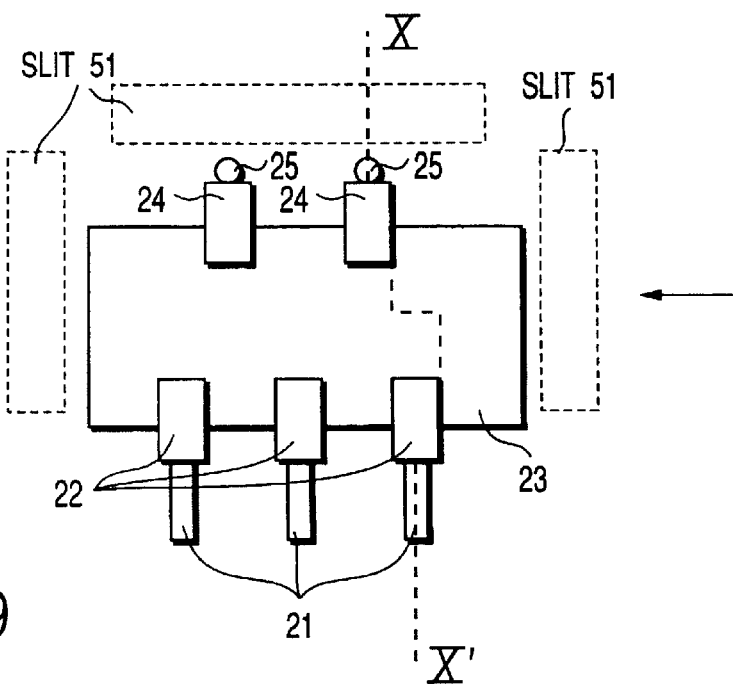
FIG. 9 is a plan view of the structure of a printed circuit board according to a second embodiment of the present invention.
Figure 10:
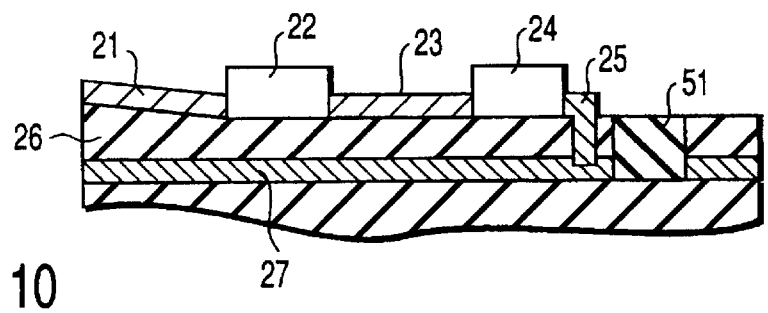
FIG. 10 is a cross-sectional view of the printed circuit board shown in FIG. 9 taken along line X-X'.

A printed circuit board according to a second embodiment of the present invention will now be described with reference to FIGS. 9 and 10. FIG. 9 is a view of the printed circuit board including termination resistors 22 connected to high-speed signal patterns 21 and a power supply plane 23, which are viewed from the top. FIG. 10 is a cross-sectional view of the printed circuit board, which is viewed from the direction of the arrow shown in FIG. 9 and along line X-X'.

As shown in FIG. 9, slits 51 are formed in a reference GND layer 27 below and around the power supply plane 23. An insulation layer 26 is formed between the power supply plane 23 and the reference GND layer 27 and made of material called prepreg. The prepreg, which is flowable in the manufacturing process of a circuit board, flows into the slits 51 of the reference GND layer 27 when a multilayer circuit board is manufactured by pressing the core and prepreg on each other. Since the slits 51 are formed below and around the power supply plane 23, the insulation layer 26 under the power supply plane 23 is thinned more than a region where the high-speed signal pattern 21 is formed, by the amount of prepreg flowing into the slits 51. The insulation layer 26 under the power supply plane 23 can thus be thinned more than that under the high-speed signal pattern 21. Consequently, the distance between the power supply plane 23 and the reference GND layer 27 is shortened, and the impedance per unit area of the power supply plane 23 can be lowered. Since, moreover, the region where the high-speed signal pattern 21 is formed is not influenced, a desired impedance (e.g., 50Ω) necessary for a signal line of the high-speed signal pattern 21 can be obtained.

Figure 11:
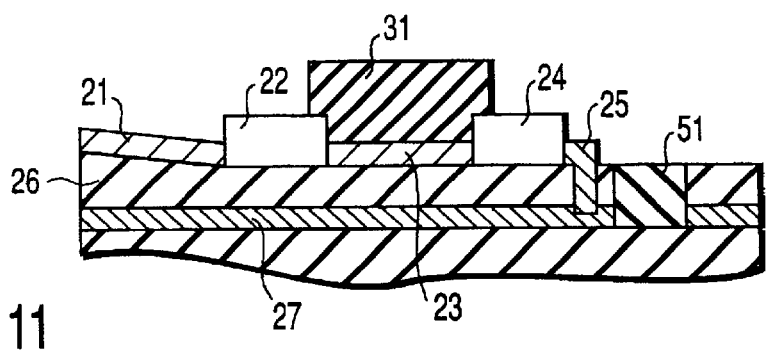
FIG. 11 is a cross-sectional view of the printed circuit board shown in FIG. 9, in which a power supply plane is coated with marking paint.

FIG. 11 shows an example in which the structure of the first embodiment is applied to that of the second embodiment. As shown in FIG. 11, coating the plane 23 with marking paint 31 which contacts the surface of the insulation layer 26, can lower the impedance of the power supply plane 23 further.

(Third Embodiment)

Figure 12:
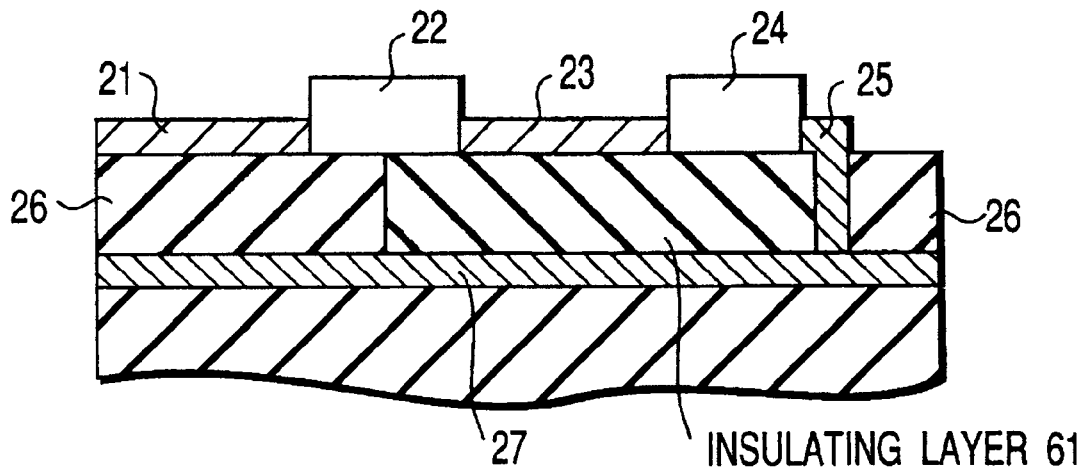
FIG. 12 is a cross-sectional view of the structure of a printed circuit board according to a third embodiment of the present invention.

FIG. 12 shows a section of a printed circuit board according to a third embodiment of the present invention.

In the third embodiment, only the region of an insulation layer 26 that is formed immediately below the power supply plane 23 differs in material form the other region thereof, and the relative dielectric constant of the former region is set higher than that of the latter region. In other words, the insulation layer 26 is constituted of two types of materials having different relative dielectric constants. An insulation layer 61, which is formed immediately below the power supply plane 23, is constituted of a material whose relative dielectric constant is higher than that of the material of the region of the insulation layer 26 where a high-speed signal pattern 21 is formed. This structure can be achieved as follows: The sheet-like insulation layer 26 is provided with a notched portion in advance and stacked on a reference GND layer 27, and then the high-relative-dielectric-constant material of the insulation layer 61 is buried into the notched portion.

The impedance of the power supply plane 23 is influenced by the relative dielectric constant of insulative materials between the power supply plane 23 and the reference GND layer 27. The higher the relative dielectric constant, the lower the impedance per unit area of the power supply plane 23. The structure shown in FIG. 12 therefore allows the impedance of the power supply plane 23 to lower without exercising an influence on the other portions.

Figure 13:
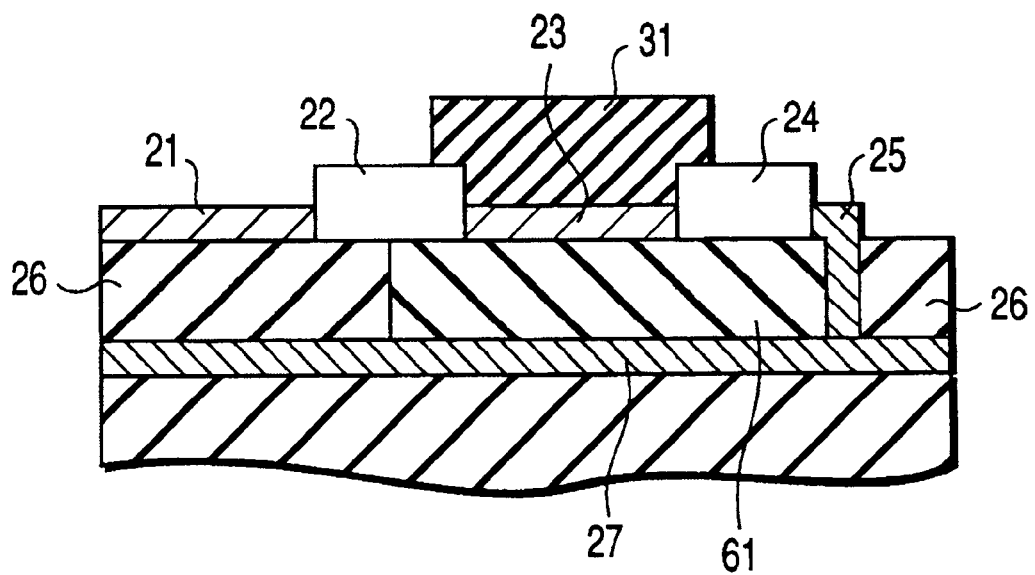
FIG. 13 is a cross-sectional view of the printed circuit board shown in FIG. 12, in which a power supply plane is coated with marking paint.

FIG. 13 shows an example in which the structure of the first embodiment is applied to that of the third embodiment.

As shown in FIG. 13, coating the plane 23 with marking paint 31 which contacts the surface of the insulation layer 26, can lower the impedance of the power supply plane 23 further.

(Fourth Embodiment)

Figure 14:
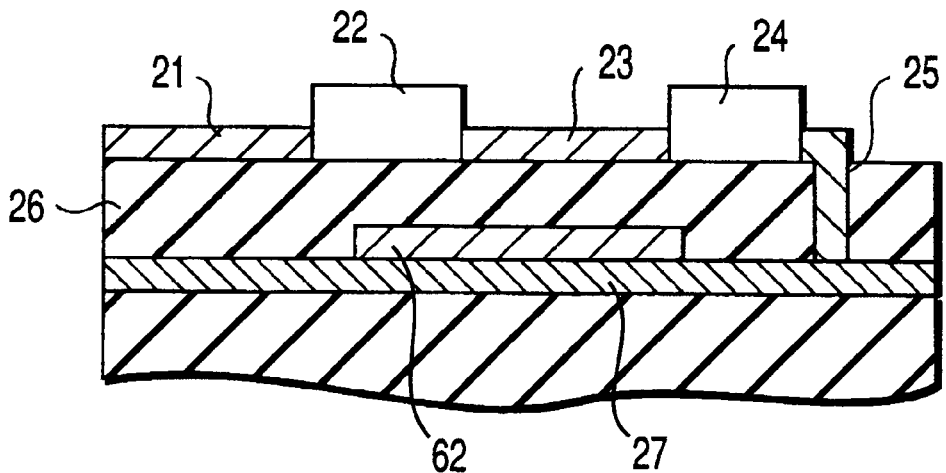
FIG. 14 is a cross-sectional view of the structure of a printed circuit board according to a fourth embodiment of the present invention.

FIG. 14 shows a section of a printed circuit board according to a fourth embodiment of the present invention.

In the fourth embodiment, a conductive member 62 is provided under a power supply plane 23 and on a reference GND layer 27 such that an insulation layer 26 formed under the power supply plane 23 is thinned more than the region thereof where a high-speed signal pattern 21 is formed. The conductive member 62 can be constituted by locally plating the reference GND layer 27 under the power supply plane 23. Thus, the reference GND layer 27 can be thickened only under the power supply plane 23, and the distance between the power supply plane 23 and the reference GND layer 27 can be shortened more than that between the high-speed signal pattern 21 and the reference GND layer 27.

It is known that the shorter the distance between the plane 23 and the layer 27, the lower the impedance per unit area of the plane 23. Consequently, the structure shown in FIG. 14 allows the impedance of the power supply plane 23 to lower without exercising an influence on the other portions.

Figure 15:
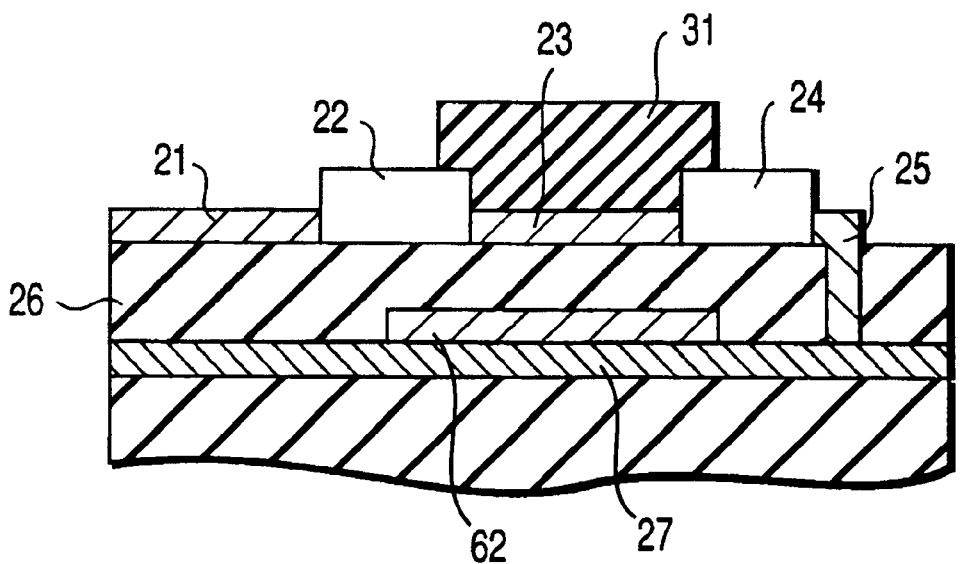
FIG. 15 is a cross-sectional view of the printed circuit board shown in FIG. 14, in which a power supply plane is coated with marking paint.

FIG. 15 shows an example in which the structure of the first embodiment is applied to that of the fourth embodiment. As shown in FIG. 15, coating the plane 23 with marking paint 31 which contacts the surface of the insulation layer 26, can lower the impedance of the power supply plane 23 further.

(Fifth Embodiment)

FIG. 16 illustrates a section of a printed circuit board according to a fifth embodiment of the present invention.

The fifth embodiment is applied to a multilayer printed circuit board. On the core of the circuit board, three power supply planes 23 and three reference GND layers 27 are alternately stacked one on another with an insulation layer 26 interposed therebetween. The three reference GND layers 27 are electrically connected to each other through two via holes 25a and 25b as shown in FIG. 16. The two via holes 25a and 25b are used to thicken a wire connecting the reference GND layers 27 to each other. The inner wall of each of the via holes 25a and 25b is coated with metal. The via hole 25a corresponds to the via hole 25 of the first to fourth embodiments described above, and its top end is connected to the uppermost power supply plane 23 through a capacitor element 24. The power supply planes 23 each of which is sandwiched between the insulation layers 27, are patterned so as not to contact the via holes 25a and 25b.

The three power supply planes 23 are electrically connected to each other through two via holes 71a and 71b as illustrated in FIG. 16. The two via holes 71a and 71b are used to thicken a wire connecting the power supply planes 23 to each other. The inner wall of each of the via holes 71a and 71b is coated with metal. The via holes 71a and 71b are provided so as not to contact the reference GND layers 27.

Since the power supply planes 23 and the reference GND layers 27 are formed in a vertical direction such that they are stacked one on another, the insulation layer 26, and the power supply plane 23 and reference GND layer 27 sandwiching the layer 26 constitute one capacitor. In the structure shown in FIG. 16, therefore, five capacitors can be obtained as illustrated in FIG. 17.

Figure 18:
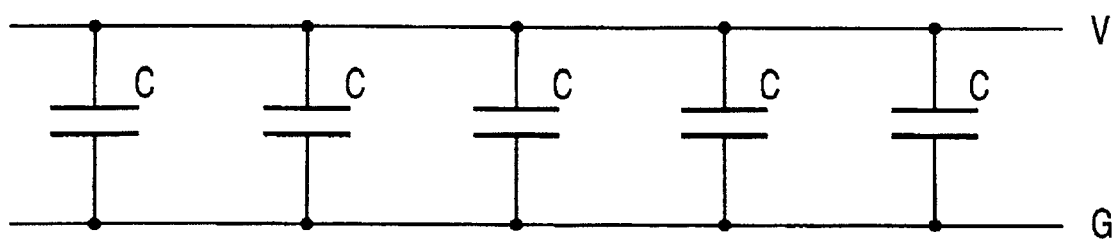
FIG. 18 is a diagram showing a relationship in electrical connection among the capacitors shown in FIG. 17.

In FIG. 17, V indicates the power supply potential of each power supply plane 23 and G denotes the ground potential. As an equivalent circuit of FIG. 17, five capacitors C are arranged in parallel between the power supply potential V and the ground potential G, as shown in FIG. 18. The parallel connection of the capacitors enhances a dielectric constant between the power supply plane 23 and the reference GND layer 27. Thus, the impedance per unit area of the power supply plane 23 can be lowered. It is essential that the number of capacitors connected in parallel be two or more.

Figure 19:
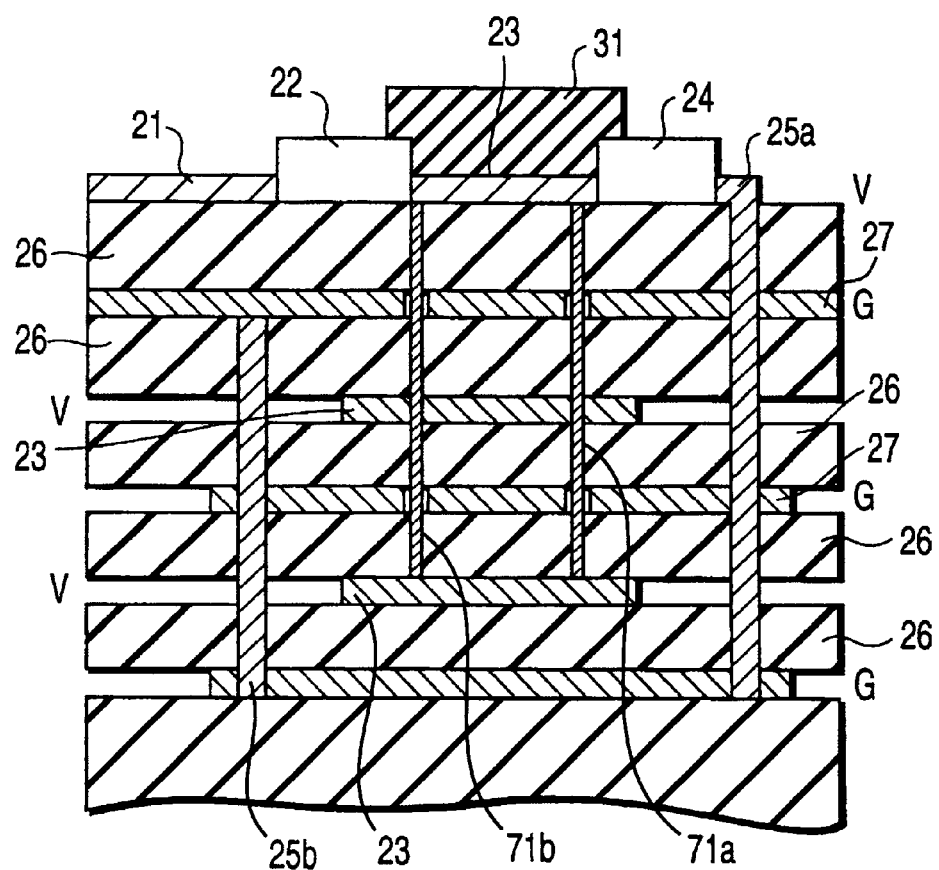
FIG. 19 is a cross-sectional view of the printed circuit board shown in FIG. 16, in which a power supply plane is coated with marking paint.

FIG. 19 shows an example in which the structure of the first embodiment is applied to that of the fifth embodiment. As shown in FIG. 19, coating the uppermost plane 23 with marking paint 31 which contacts the surface of the uppermost insulation layer 26, can lower the impedance of the power supply planes 23 further.

The printed circuit boards of the respective embodiments described above can be applied to various types of electronic equipment using a termination resistor to prevent a signal from being reflected, and allows a high-speed signal interface sufficiently reduced in noise in cellular phones, computers and the like.

Only the microstrip line structure has been described in the foregoing embodiments. The structures of the second to fifth embodiments can be applied to a strip line structure having a conductive layer for forming a signal pattern on its inner-layer side. Furthermore, the marking paint 31 can be replaced with another insulating material (dielectric material). The respective embodiments can be combined with each other appropriately.

The power supply plane 23 of the wiring layer constitutes a feeding section together with the capacitor element 24. In place of the capacitor element 24, other different electronic components can be used as circuits of the feeding section.

(Information Processing Apparatus)

FIG. 20 illustrates a configuration of a computer system as an example of an information processing apparatus using the printed circuit board of the above embodiments as a system board. The computer system is a personal computer (PC) of a laptop type or a notebook type, and it is constituted of various electronic components mounted on the system board.

More specifically, a CPU bus (processor bus) 1, a PCI bus 2, an ISA bus 3, a memory bus 4, a CPU 111, a host-PCI bridge 112, a main memory 114, a PCI-ISA bridge 117, other PCI devices 118, and a BIOS-ROM 119 are mounted on the system board of the computer system.

The CPU 111 controls the operation of the computer system and executes various application programs as well as a BIOS and an operating system.

The host-PCI bridge 112 is a bus bridge device for connecting the CPU bus 1 and the PCI bus 2 bidrectionally. The bridge 112 includes a memory controller 113 for accessing the main memory 114 mounted on the system board. The memory controller 113 is connected to the main memory 114 via the memory bus 4, as shown in FIG. 20.

A high-speed semiconductor memory device, such as a Rambus memory, is employed as the main memory 114. A plurality of memory mounting areas are provided on the system board in order to mount chips of the high-speed semiconductor device, and the memory devices can be mounted by the number of memory mounting areas at the maximum. The number of memory devices to be mounted is determined in accordance with models of the computer system. The memory bus 4 is achieved by the high-speed signal pattern 21 described above.

The PCI-ISA bridge 117 is a bridge device for connecting the PCI bus 2 and the ISA bus 3 bidirectionally and serves as a peripheral chip set of the computer system together with the host-PCI bridge 112.

The BIOS-ROM 119 stores BIOS (basic input output system). The BIOS is a system of a function of controlling hardware of the computer system and used to turn on/off the system and start the system.

Furthermore, the foregoing high-speed signal pattern 21 can be applied to the CPU bus 1.

According to the present invention described above, devising the structure of the circuit board can lower the impedance between the power supply and the ground and precise impedance matching can be performed. Thus, a high-speed signal interface electronic equipment adopting the printed circuit board. A high-speed signal interface sufficiently reduced in noise can be achieved in various types of electronic equipment using a termination resistor to prevent a signal from being reflected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A printed circuit board comprising:

a ground layer;

an insulation layer provided on the ground layer;

a signal line provided on the insulation layer, the signal line being exposed;

a power supply plane provided on the insulation layer, which feeds power to the signal line through a termination resistor; and a dielectric material which covers the power supply plane, the dielectric material contacting a top surface and a side surface of the power supply plane, and contacting the insulation layer.

2. The printed circuit board according to claim 1, wherein the dielectric material comprises a marking paint which marks the printed circuit board.

3. The printed circuit board according to claim 1, further comprising a via hole formed through the insulation layer, one end of the via hole being connected to the power supply plane through a capacitor element provided on the insulation layer, and another end of the via hole being connected to the ground layer.

4. The printed circuit board according to claim 1, wherein the termination resistor is provided on the insulation layer, and connected between the signal line and the power supply plane.

5. The printed circuit board according to claim 1, further comprising a via hole formed through the insulation layer, one end of the via hole being connected to the power supply plane through a capacitor element provided on the insulation layer, and another end of the via hole being connected to the ground layer, wherein the termination resistor is provided on the insulation layer, and connected between the signal line and the power supply plane.

* * * * *